(12) United States Patent
Hishiya et al.

(10) Patent No.: US 8,231,381 B2
(45) Date of Patent: Jul. 31, 2012

(54) PROCESSING SYSTEM FOR PROCESS OBJECT AND THERMAL PROCESSING METHOD FOR PROCESS OBJECT

(75) Inventors: Katsuyuki Hishiya, Oshu (JP); Kiichi Takahashi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 890 days.

(21) Appl. No.: 12/285,320

(22) Filed: Oct. 1, 2008

(65) Prior Publication Data

US 2009/0092940 A1 Apr. 9, 2009

(30) Foreign Application Priority Data

Oct. 3, 2007 (JP) ................... 2007-259690

(51) Int. Cl.
*F27D 5/00* (2006.01)
(52) U.S. Cl. ............. 432/6; 432/241; 432/247; 414/938
(58) Field of Classification Search ............... 432/5, 6, 432/9, 241, 247, 239; 414/935–938
See application file for complete search history.

(56) References Cited

U.S. PATENT DOCUMENTS

| | | | | |
|---|---|---|---|---|
| 5,221,201 A | * | 6/1993 | Yamaga et al. | 432/241 |
| 5,447,294 A | * | 9/1995 | Sakata et al. | 266/257 |
| 5,462,397 A | * | 10/1995 | Iwabuchi | 414/217 |
| 5,562,383 A | * | 10/1996 | Iwai et al. | 414/217.1 |
| 5,829,939 A | * | 11/1998 | Iwai et al. | 414/411 |
| 5,829,969 A | * | 11/1998 | Miyashita et al. | 432/253 |
| 5,853,486 A | * | 12/1998 | Ono et al. | 118/719 |
| 6,729,823 B2 | | 5/2004 | Sakata et al. | |
| 7,210,924 B2 | * | 5/2007 | Mochizuki et al. | 432/253 |

(Continued)

FOREIGN PATENT DOCUMENTS

JP 8-279546 10/1996

(Continued)

OTHER PUBLICATIONS

Japanese Office Action issued on Sep. 20, 2011 for Application No. 2007-259690 with English translation.

(Continued)

*Primary Examiner* — Gregory A Wilson
(74) *Attorney, Agent, or Firm* — Smith, Gambrell & Russell, LLP (57) ABSTRACT

To provide a processing system for a process object capable of preventing a transport arm mechanism from being thermally damaged, so as to effectively perform a transport operation of the process object. A processing system 2, which takes out a process object W from a storage box 6 for process object, and thermally process the process object, includes: a vertical processing unit 24; a process-object transport area 10 disposed below the processing unit; a plurality of process-object boats 20 configured to hold the process objects; a boat elevating means 68 configured to vertically move the process-object boat 20; a boat table for transport 52, on which the process-object boat can be placed; and a transport arm mechanism configured to transport the process objects between the storage box 6 and the process-object boat 20 placed on the boat table for transport 52. The transport arm mechanism 56 is vertically moved by an arm elevating means 58. A temperature measuring means 86 is disposed in an upper part in the process-object transport area. The transport arm mechanism 58 and the arm elevating means 58 are controlled by a transport control part 88 based on a measured value of the temperature measuring means 86, so that a transport operation of the transport arm mechanism is controlled.

16 Claims, 7 Drawing Sheets

U.S. PATENT DOCUMENTS

| | | | |
|---|---|---|---|
| 7,819,658 B2 * | 10/2010 | Sakata et al. | 432/253 |
| 2002/0048509 A1 * | 4/2002 | Sakata et al. | 414/800 |
| 2002/0197145 A1 * | 12/2002 | Yamamoto et al. | 414/806 |
| 2009/0114150 A1 * | 5/2009 | Yoneda et al. | 118/696 |
| 2009/0143876 A1 * | 6/2009 | Sugawara et al. | 700/79 |

FOREIGN PATENT DOCUMENTS

| | | |
|---|---|---|
| JP | 9-306975 | 11/1997 |
| JP | 11-274267 | 10/1999 |
| JP | 2002-76089 | 3/2002 |
| JP | 2003-37148 | 2/2003 |
| JP | 2004-22674 | 1/2004 |
| JP | 2005-101027 | 4/2005 |
| KR | 10-2002-0015957 | 3/2002 |

OTHER PUBLICATIONS

Korean Office Action issued on Mar. 8, 2012 for Application No. 10-2008-97029 w/ English language translation.

* cited by examiner

PROCESSING SYSTEM FOR PROCESS OBJECT AND THERMAL PROCESSING METHOD FOR PROCESS OBJECT

CROSS REFERENCE TO RELATED APPLICATIONS

This application is based upon and claims the benefit of priority from the prior Japanese Patent Application No. 2007-259690 filed on Oct. 3, 2007, the entire contents of which are incorporated herein by reference.

FIELD OF THE INVENTION

The present invention relates to a processing system and a thermal processing method, in which a process object (object to be processed) such as a semiconductor wafer is transferred from a storage box storing the process object to a process-object boat in a process-object transport area, and the process object is thermally processed.

BACKGROUND ART

In general, in order to manufacture semiconductor integrated circuits such as ICs and LSIs, various processes, such as a film deposition process, an oxidation and diffusion process, and an etching process, are repeatedly performed to semiconductor wafers. When the respective processes are performed, it is necessary to transfer the semiconductor wafers between apparatuses. In this case, a plurality of, e.g., twenty five semiconductor wafers stored in a storage box are transferred at a time. As the storage box of this type, there are known a cassette and a FOUP (registered trademark) (Patent Documents 1 to 3). The cassette transfers semiconductor wafers, with an inside thereof being opened to an atmospheric air. On the other hand, the FOUP transfers semiconductor wafers stored in a box that is hermetically sealed by a lid, with an inside of the box being filled with an inert gas such as an $N_2$ gas or a clean air, in order to restrain adhesion of particles and a natural oxidation film to the semiconductor wafers.

A processing system of a batch type, for example, which handles the storage box, includes a box transfer area in which the storage box is transferred by a transfer mechanism, and a process-object transport area in which semiconductor wafers are transported so as to be thermally processed, from the storage box to a wafer boat (for example, Patent Documents 4 to 6). Those areas are separated by a partition wall having a gate capable of being opened and closed for sending and receiving wafers. The process-object transport area, in which process objects are transferred in a bare state, has an inert gas atmosphere such as a nitrogen atmosphere, or a clean atmosphere.

In the process-object transport area, a plurality of, e.g., twenty five wafers stored in the storage box are transported at a time to the wafer boat, until the wafer boat becomes completely filled with the wafers, for example. In this case, a certain time period is required to finish the transport operation. For example, when a capacity of the wafer boat allows accommodation of one hundred wafers, it is necessary to transport wafers, while exchanging the four storage boxes. Thus, depending on a performance of a transport arm mechanism, it takes as long as fourteen minutes, for example, for the transport operation.

Thus, in order to improve a throughput, a plurality of, e.g., two wafer boats are generally provided in the process-object transport area. While wafers are thermally processed in one boat, transport of thermally processed wafers and unprocessed wafers is performed in the other boat, so as not to waste time as much as possible (Patent Documents 4 and 5).

[Patent Document 1] JP8-279546A
[Patent Document 2] JP9-306975A
[Patent Document 3] JP11-274267A
[Patent Document 4] JP2002-76089A
[Patent Document 5] JP2003-37148A
[Patent Document 6] JP2004-22674A In the transport arm mechanism for transporting wafers, there are used components which are relatively susceptible to a heat, i.e., which are poor in heat resistance. For example, the transport arm mechanism is provided with an exposed mapping sensor that detects positions of wafers supported by the wafer boat and positions of wafers stored in the storage box in a tier-like manner. In addition, the transport arm mechanism incorporates various electronic components. Further, a driving force of the transport arm mechanism is often obtained by a compressed air. In this case, there are disposed, in an exposed manner, air pipes through which the compressed air is supplied and discharged. The mapping sensor, the electronic components, the air pipes, and so on, are all poor in heat resistance, and are capable of resisting heat as low as about 50° C. to 200° C., which varies between the members.

In the process-object transport area, although a cooling gas or a clean air is circulated, an atmospheric temperature, in particular an upper atmospheric temperature in the process-object transport area, sometimes exceeds 200° C. by a convection and a radiation heat, when thermally processed wafers, which have a temperature of as high as 700° C. to 800° C., are unloaded downward in the process-object transport area. In order to prevent the transport arm mechanism that is poor in heat resistance from being thermally damaged, the wafer transport operation is forbidden in such a manner that, in the course of unloading the wafers, the transport arm mechanism is withdrawn to a bottom position of the process-object transport area in which a temperature is relatively lower.

In this case, the transport arm mechanism is withdrawn for a long time, namely, from when the unloading operation is started to when the upper atmospheric temperature in the process-object transport area is sufficiently cooled after completion of the unloading operation. There is a possibility that, although the upper atmospheric temperature in the process-object transport area has been lowered to a safety temperature for the respective aforementioned members constituting the transport arm mechanism, the wafer transport operation remains forbidden. This invites deterioration in throughput.

DISCLOSURE OF THE INVENTION

An object of the present invention is to provide a processing system for a process object, capable of efficiently transporting process object by minimizing a withdrawal time of the transport arm mechanism, while preventing the transport arm mechanism from being thermally damaged. As a result, a throughput can be improved. Another object of the present invention is to provide a thermal processing method therefor.

The present invention is a processing system for a process object surrounded by a partition wall, the processing system comprising: a vertical processing unit configured to thermally process the process object; a process-object transport area disposed below the processing unit; a pair of process-object boats configured to hold the process objects in a tier-like manner; a boat elevating means configured to vertically move the one process-object boat so as to load and unload one process-object boat into and from the processing unit; a boat table for transport disposed in the process-object transport area, on which the other process-object boat can be placed, when the process objects are transported; a transport arm mechanism configured to transport the process objects between a storage box placed on a transport stage disposed on the partition wall and the other process-object boat placed on the boat table for transport; an arm elevating means configured to vertically move the transport arm mechanism; a temperature measuring means disposed on an upper part in the process-object transport area; and a transport control part configured to control a transport operation of the transport arm mechanism and the arm elevating means, based on a measurement value from the temperature measuring means.

According to the present invention, since the temperature measuring means is disposed on the upper part in the process-object transport area in which the process objects are transported to the process-object boat, and the transport operation of the transport arm mechanism is controlled based on a measurement value of the temperature measuring means, the process objects can be efficiently transported by minimizing the withdrawal time of the transport arm mechanism, while preventing the transport arm mechanism from being thermally damaged. As a result, a throughput can be improved.

The present invention is the processing system for a process object wherein disposed in the process-object transport area is a boat table for waiting, on which the process-object boat can be temporarily placed on standby.

The present invention is the processing system for a process object wherein an inside of the process-object transport area has an inert gas atmosphere or a clean air atmosphere.

The present invention is the processing system for a process object wherein the transport control part controls: the transport arm mechanism and the arm elevating means such that the transport of the process objects is forbidden, on and after the temperature measuring means detecting a first temperature, after an unloading operation for lowering the one process-object boat from the processing unit has been started; and the transport arm mechanism and the arm elevating means such that the forbiddance of the transport of the process objects is released, on and after the temperature measuring means detecting a second temperature that is higher than the first temperature, after the unloading operation has been completed.

The present invention is the processing system for a process object wherein the transport control part causes the transport arm mechanism to move to be located on a lower part in the process-object transport area, on and after the transport control part controlling the transport arm mechanism and the arm elevating means such that the transport of the process objects is forbidden.

The present invention is the processing system for a process object wherein the transport arm mechanism is provided with a mapping sensor that detects a position of the process object stored in the storage box, or a position of the process object supported by the process-object boat; and the second temperature is a maximum heat-resistant temperature of the mapping sensor.

The present invention is the processing system for a process object wherein the transport arm mechanism is provided with an electronic component protected by a cover; and the first temperature is a maximum heat-resistant temperature of the electronic component.

The present invention is the processing system for a process object wherein there is disposed one or more temperature measuring means, and at least one temperature measuring means is positioned above the transport arm mechanism.

The present invention is a thermal processing method for a process object, for thermally processing the process object with the use of a processing system for a process object surrounded by a partition wall, the processing system comprising: a vertical processing unit configured to thermally process the process object; a process-object transport area disposed below the processing unit; a pair of process-object boats configured to hold the process objects in a tier-like manner; a boat elevating means configured to vertically move the one process-object boat so as to load and unload one process-object boat into and from the processing unit; a boat table for transport disposed in the process-object transport area, on which the other process-object boat can be placed, when the process objects are transported; a transport arm mechanism configured to transport the process objects between a storage box placed on a transport stage disposed on the partition wall and the other process-object boat placed on the boat table for transport; an arm elevating means configured to vertically move the transport arm mechanism; a temperature measuring means disposed on an upper part in the process-object transport area; and a transport control part configured to control a transport operation of the transport arm mechanism and the arm elevating means, based on a measurement value from the temperature measuring means; the processing method comprising: a thermal processing step in which the one process-object boat holding a plurality of process objects is loaded into the processing unit by the boat elevating means so as to thermally process the process objects, and, after the thermal process, the process-object boat is unloaded by the boat elevating means; a transport step in which the process objects are transported between the storage box and the other process-object boat, by using the transport arm mechanism and the arm elevating means; a temperature measuring step in which a temperature of an upper atmosphere in the process-object transport area is measured by the temperature measuring means; a first judgment step in which the transport control part controls the transport arm mechanism and the arm elevating means so as to prohibit the transport operation in the transport step, in response to detection of a first temperature by the temperature measuring means; and a second judgment step in which the transport control part controls the transport arm mechanism and the arm elevating means so as to release the prohibition of the transport operation in the transport step, in response to detection of a second temperature by the temperature measuring means.

The present invention is the thermal processing method for a process object wherein during the prohibition of the transport operation, the transport control part controls the transport arm mechanism and the arm elevating means so as to cause the transport arm mechanism to withdraw to be located on a lower part in the process-object transport area.

The present invention is the thermal processing method for a process object wherein the transport control part performs the first judgment step, on condition that the unloading operation has been started in the course of the thermal processing step.

The present invention is the thermal processing method for a process object wherein the transport control part performs the second judgment step, on condition that the unloading operation has been completed in the course of the thermal processing step.

The present invention is the thermal processing method for a process object wherein: the transport arm mechanism is provided with a mapping sensor that detects a position of the process object stored in the storage box, or a position of the process object supported by the process-object boat; and the second temperature is a maximum heat-resistant temperature of the mapping sensor.

The present invention is the thermal processing method for a process object wherein: the transport arm mechanism is provided with an electronic component protected by a cover; and the first temperature is a maximum heat-resistant temperature of the electronic component.

The present invention is a computer program executable by a computer to perform a thermal processing method for a process object, for thermally processing the process object with the use of a processing system for a process object surrounded by a partition wall, the processing system comprising: a vertical processing unit configured to thermally process the process object; a process-object transport area disposed below the processing unit; a pair of process-object boats configured to hold the process objects in a tier-like manner; a boat elevating means configured to vertically move the one process-object boat so as to load and unload one process-object boat into and from the processing unit; a boat table for transport disposed in the process-object transport area, on which the other process-object boat can be placed, when the process objects are transported; a transport arm mechanism configured to transport the process objects between a storage box placed on a transport stage disposed on the partition wall and the other process-object boat placed on the boat table for transport; an arm elevating means configured to vertically move the transport arm mechanism; a temperature measuring means disposed on an upper part in the process-object transport area; and a transport control part configured to control a transport operation of the transport arm mechanism and the arm elevating means, based on a measurement value from the temperature measuring means; the processing method comprising: a thermal processing step in which the one process-object boat holding a plurality of process objects is loaded into the processing unit by the boat elevating means so as to thermally process the process objects, and, after the thermal process, the process-object boat is unloaded by the boat elevating means; a transport step in which the process objects are transported between the storage box and the other process-object boat, by using the transport arm mechanism and the arm elevating means; a temperature measuring step in which a temperature of an upper atmosphere in the process-object transport area is measured by the temperature measuring means; a first judgment step in which the transport control part controls the transport arm mechanism and the arm elevating means so as to prohibit the transport operation in the transport step, in response to detection of a first temperature by the temperature measuring means; and a second judgment step in which the transport control part controls the transport arm mechanism and the arm elevating means so as to release the prohibition of the transport operation in the transport step, in response to detection of a second temperature by the temperature measuring means.

The present invention is a storage medium storing a computer program executable by a computer to perform A thermal processing method for a process object, for thermally processing the process object with the use of a processing system for a process object surrounded by a partition wall, the processing system comprising: a vertical processing unit configured to thermally process the process object; a process-object transport area disposed below the processing unit; a pair of process-object boats configured to hold the process objects in a tier-like manner; a boat elevating means configured to vertically move the one process-object boat so as to load and unload one process-object boat into and from the processing unit; a boat table for transport disposed in the process-object transport area, on which the other process-object boat can be placed, when the process objects are transported; a transport arm mechanism configured to transport the process objects between a storage box placed on a transport stage disposed on the partition wall and the other process-object boat placed on the boat table for transport; an arm elevating means configured to vertically move the transport arm mechanism; a temperature measuring means disposed on an upper part in the process-object transport area; and a transport control part configured to control a transport operation of the transport arm mechanism and the arm elevating means, based on a measurement value from the temperature measuring means; the processing method comprising: a thermal processing step in which the one process-object boat holding a plurality of process objects is loaded into the processing unit by the boat elevating means so as to thermally process the process objects, and, after the thermal process, the process-object boat is unloaded by the boat elevating means; a transport step in which the process objects are transported between the storage box and the other process-object boat, by using the transport arm mechanism and the arm elevating means; a temperature measuring step in which a temperature of an upper atmosphere in the process-object transport area is measured by the temperature measuring means; a first judgment step in which the transport control part controls the transport arm mechanism and the arm elevating means so as to prohibit the transport operation in the transport step, in response to detection of a first temperature by the temperature measuring means; and a second judgment step in which the transport control part controls the transport arm mechanism and the arm elevating means so as to release the prohibition of the transport operation in the transport step, in response to detection of a second temperature by the temperature measuring means.

According to the processing system for a process object and the thermal processing method for a process object of the present invention, the following excellent effects can be produced. That is to say, since the temperature measuring means is disposed on the upper part in the process-object transport area in which the process objects are transported to the process-object boat, and the transport operation of the transport arm mechanism is controlled based on a measurement value of the temperature measuring means, the process objects can be efficiently transported by minimizing the withdrawal time of the transport arm mechanism, while preventing the transport arm mechanism from being thermally damaged. As a result, a throughput can be improved.

BEST MODE FOR CARRYING OUR THE INVENTION

Suitable embodiments of a processing system for a process object and a thermal processing method for a process object of the present invention will be described in detail below with reference to the accompanying drawings.

Figure 1:
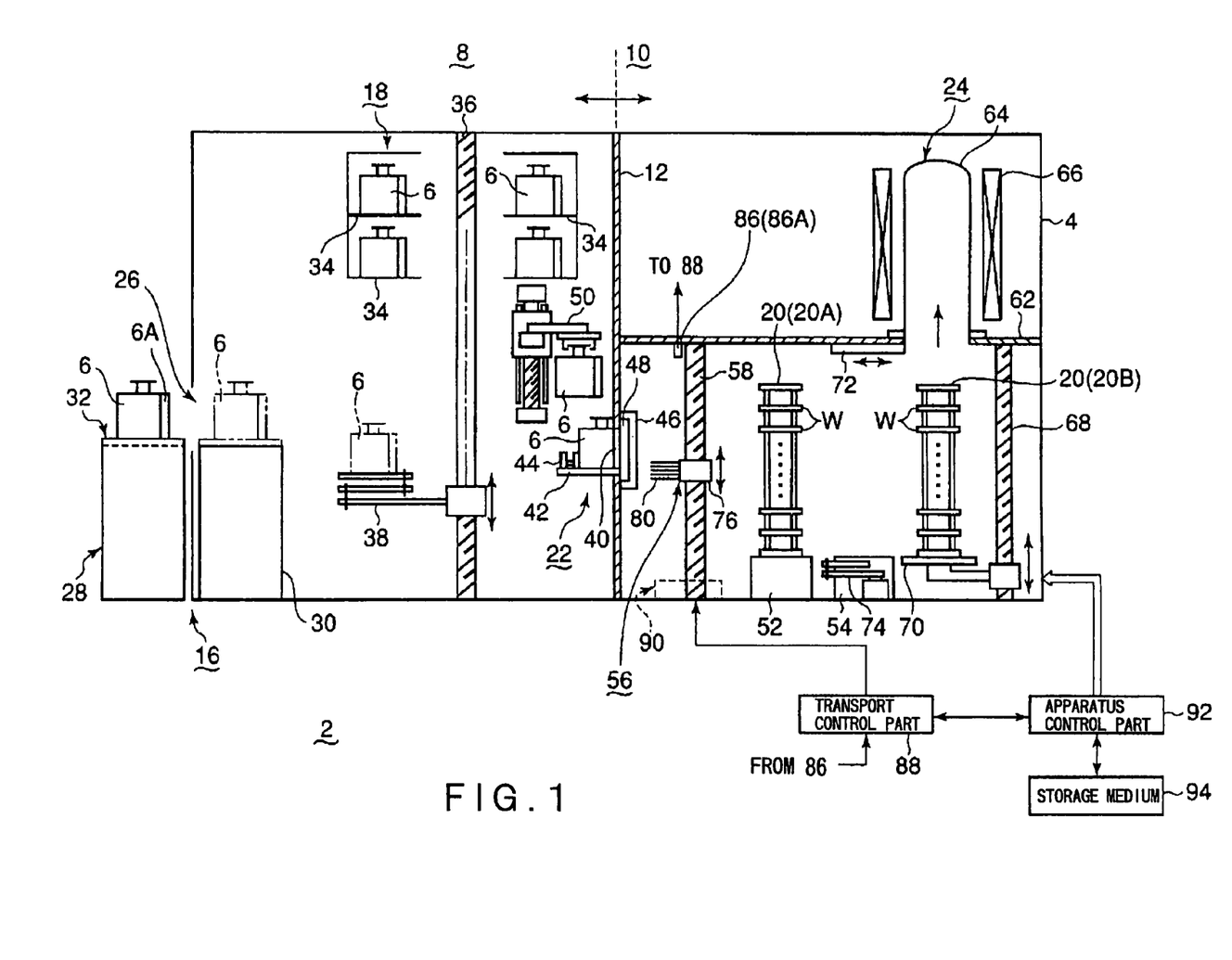
FIG. 1 is a schematic structural view showing an example of a processing system for a process object of the present invention.
Figure 2:
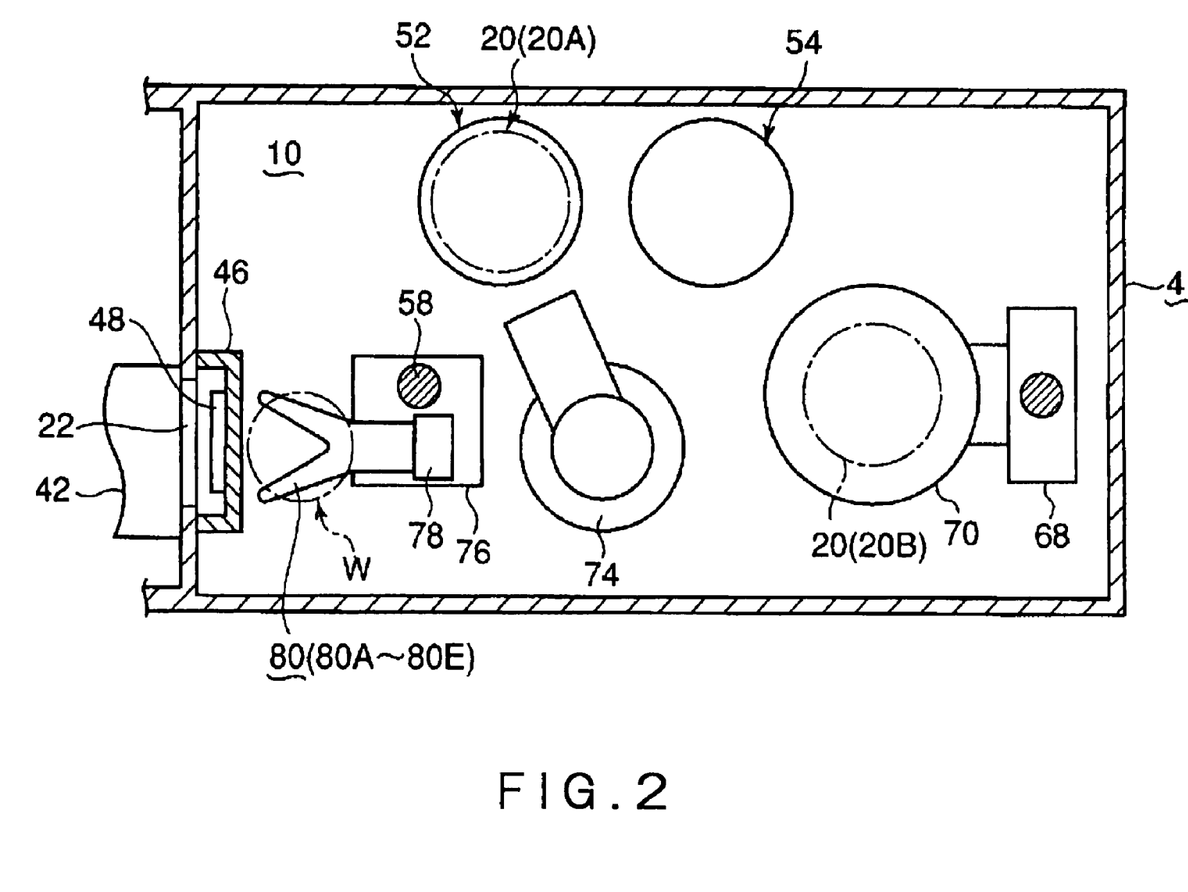
FIG. 2 is a plan view showing an example of arrangement of respective constituent elements in a process-object transport area.
Figure 3:
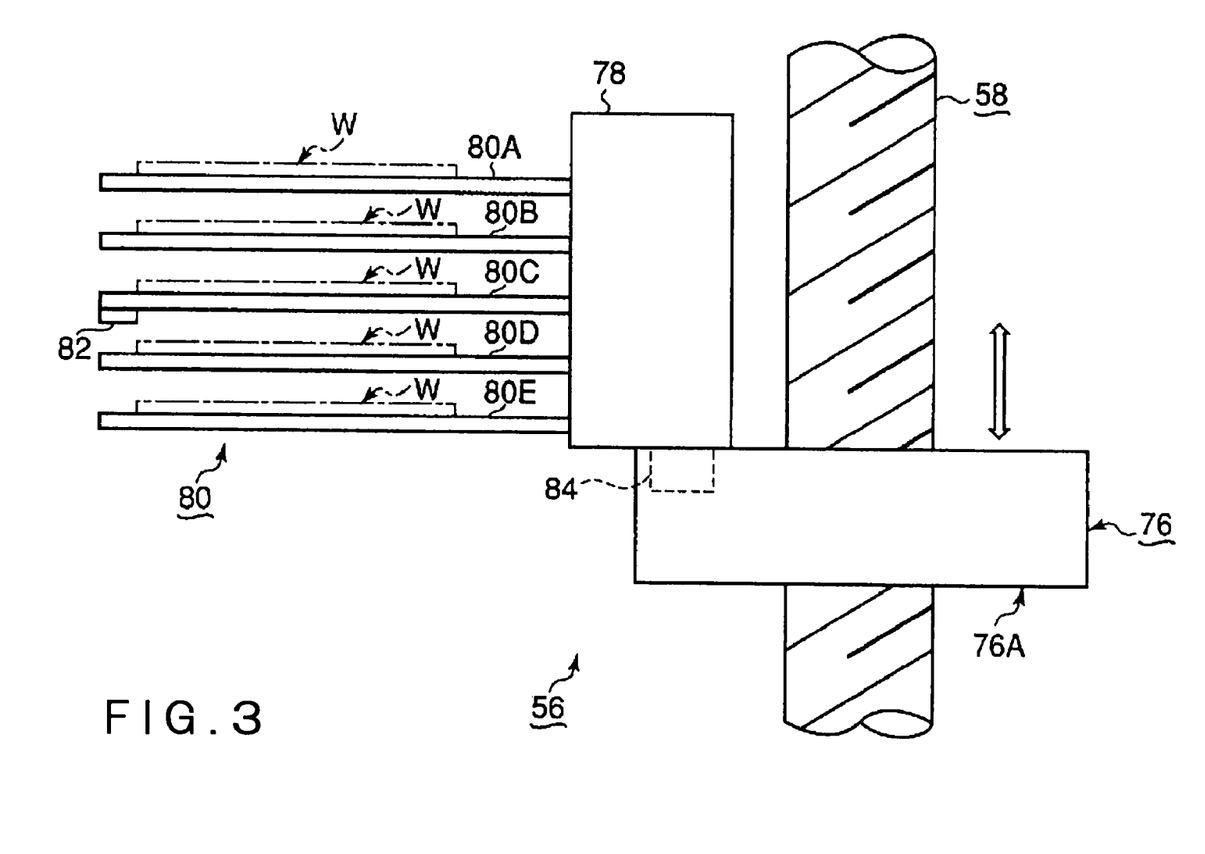
FIG. 3 is a view showing an example of a transport arm mechanism for a process object.

FIG. 1 is a schematic structural view showing an example of the processing system for a process object of the present invention. FIG. 2 is a plan view showing an example of arrangement of respective constituent elements in a process-object transport area. FIG. 3 is a view showing an example of a transport arm mechanism for a process object.

As shown in FIGS. 1 and 2, the processing system for a process object 2 is surrounded by a housing 4 made of, e.g., a stainless steel, which functions as a partition wall as a whole. An inside of the processing system 2 is divided into, by a partition wall 12, two areas, i.e., a storage-box transfer area 8 in which a storage box 6 is transferred, and a process-object transport area 10 in which a semiconductor wafer W as a process object (object to be processed) is transported. Herein, although the wafer W is a 300 mm wafer, an 8 inch wafer and a 6 inch wafer can be also used. In the storage box 6, a plurality of, e.g., twenty five wafers are supported in a tier-like manner. The storage box 6 is hermetically sealed by a lid 6A. The inside of the storage box 6 has an inert gas atmosphere such as an $N_2$ gas atmosphere, or a clean air atmosphere. A downflow of a clean air is caused to flow in the storage-box transfer area 8. An inside of the process-object transport area 10 has an inert gas atmosphere such as an $N_2$ gas atmosphere. There is a case in which a clean air is caused to flow in the area 10.

The processing system 2 includes: a processing unit 24 disposed on one side of the housing 4, the processing unit 24 performing a predetermined thermal process to semiconductor wafers W held by a process-object boat 20; a loading/unloading port 16 disposed on the other side of the housing 4, through which the storage box 6 is loaded and unloaded into and from the processing system 2; a stocker part 18 disposed near the loading/unloading port 16, the stocker part 18 temporarily receiving the storage box 6; and a transport stage 22 on which semiconductor wafers W are transported between the storage box sent from the stocker part 18 and the process-object boat 20 in the process-object transport area 10.

At the loading/unloading port 16, the housing 4 is provided with a box loading/unloading opening 26 that is always opened. Alternatively, the box loading/unloading opening can be opened and closed by a door. Outside the box loading/unloading opening 26, there is disposed an outside table 28 on which the storage box 6 transferred from outside is placed. In addition, inside the box loading/unloading opening 26, there is disposed an inside table 30 on which the storage box 6, which has been moved from the outside table 28 in a sliding manner, is placed. On an upper part of the outside table 28 or the inside table 30, there is provided a slide plate 32 that slidably moves between the tables 28 and 30. The slide plate 32 is capable of being moved, with the storage box 6 being placed thereon.

On the other hand, the stocker part 18 is positioned on an upper part of the storage-box transfer area 8. The stocker part 18 is equipped with shelf boards 34 on which the storage box 6 can be temporarily placed on standby. In the illustrated example, the shelf boards 34 are arranged in two columns and two rows. However, the number of the shelf boards 34 is not particularly limited, and more shelf boards 34 are actually disposed.

An upright elevator 36 is disposed between the two shelf boards 34. The elevator 36 has a box transfer arm 38 capable of being horizontally moved in a back and forth direction and being turned. By expanding or contracting and elevating or lowering the box transfer arm 38, the storage box 6 can be held by the box transfer arm 38, and can be transferred between the loading/unloading port 16 and the stocker part 18.

At the transport stage 22, the partition wall 12 separating the areas 8 and 10 is provided with an opening 40 which is slightly larger than the lid 6A of the storage box 6. On a side of the storage-box transfer area 8 of the opening 40, there is horizontally disposed a table 42 on which the storage box 6 can be placed. Disposed on one side of the table 42 is a horizontal actuator 44 that presses and urges the storage box 6 placed on the table 42 onto the partition wall 12. Thus, an opening periphery of the opening of the storage box 6 is brought into contact with an opening periphery of the opening 40 of the partition wall 12 in a substantially air-tight manner, with the lid 6A of the storage box 6 facing the opening 40.

On a side of the process-object transport area 10 of the opening 40, there is provided a door 46 that is laterally slidable so as to open and close the opening 40. The door 46 is equipped with a lid opening/closing mechanism 48 (see, FIG. 2) that opens and closes the lid 6A of the storage box 6. In the storage-box transfer area 8, there is disposed, near the opening 40, a box transfer arm for waiting 50 on which the storage box 6 can be placed on standby. The box transfer arm 50 receives the storage box 6, which stores wafers to be subsequently processed, from the box transfer arm 38, and waits. After waiting, the box transfer arm 50 places the storage box 6 on the transport stage 22. Alternatively, the box transfer arm for waiting 50 may not be disposed. In this case, the storage box 6 is moved by the storage transfer arm 38 and placed on the transport stage 22.

On the other hand, in the process-object transport area 10, there are provided two boat tables, namely, a boat table for transport 52 and a boat table for waiting 54, on which the process-object boat 20 as a wafer boat can be placed. Between the boat table for waiting 52 and the transport stage 22, there is provided a transport arm mechanism 56 capable of being horizontally moved in the back and forth direction and being turned. The transport arm mechanism 56 can be vertically moved (in an up and down direction) by an arm elevating means 58 such as an elevator. A ball screw may be used as the arm elevating means 58, for example.

By driving the transport arm mechanism 56 so as to be expanded or contracted, turned, and elevated or lowered, wafers W can be transported between the storage box 6 on the table 42 and the process-object boat 20 on the boat tale for transport 52. As the process-object boat 20, there are provided a plurality of, e.g., two process-object boats 20A and 20B, and the two boats 20A and 20B are alternately used. The number of the process-object boats 20 may be three or more.

The process-object boat 20 is made of, e.g., quartz, and can support a plurality of, e.g., about 50 to 150 wafers W at predetermined pitches therebetween in a tier-like manner. As concretely shown in FIG. 3, the transport arm mechanism 56 has a base support 76 that is vertically moved by the arm elevating means 58. The base support 76 has an arm support 78 capable of being moved in a sliding manner and being turned. The arm support 78 is equipped with a plurality of forked arms 80 that are arranged in the up and down direction. The arms 80 is capable of being independently, horizontally moved in the back and forth direction, with wafers W being placed thereon. As the arms 80, there are provided, in this embodiment, five arms 80A, 80B, 80C, 80D, and 80E. Thus, up to five wafers W can be simultaneously transported.

One of the five arms 80A to 80E, e.g., the central arm 80C is equipped with, at a distal end thereof, a mapping sensor 82 that detects a presence of a wafer W. By scanning the inside of the storage box 6 in a longitudinal direction, or by scanning the inside of the process-object boat 20 in the longitudinal direction, the mapping sensor 82 can detect a position on which a wafer W is stored. The mapping sensor 82 is composed of a light emitter and a light receiver, for example. A heat resistance thereof is not so high, and a maximum heat-resistant temperature is about 130° C., for example.

The base support 76 incorporates an electronic component 84 forming an electronic circuit relating to the mapping sensor 82, and electronic circuits for controlling driving of the respective arms 80A to 80E, with the electronic component 84 being protected by a cover 76A of the base support 76. A maximum heat-resistant temperature of the electronic component 84 is lower than that of the mapping sensor 82, and is about 50° C., for example. In addition, the transport arm mechanism 56 has flexible resin air tubes (not shown) through which a pressurized air is supplied and discharged for driving the respective arms 80A to 80E and the arm support 78.

Located in an upper part of one side of the process-object transport area 10 is the processing unit 24 formed of a vertical processing furnace which is supported by a base plate 62. The processing unit 24 has a cylindrical processing vessel 64 made of quartz. A cylindrical heater 66 is disposed around the processing vessel 64, whereby wafers in the processing vessel 64 can be heated. Thus, a large number of wafers W can be simultaneously subjected to a predetermined thermal process such as a film deposition process and/or an oxidation and diffusion process.

In this case, although depending on a kind of the process, a temperature of the wafer reaches about up to 800° C. to 1000° C., for example. Disposed below the processing vessel 64 is a lid 70 capable of being vertically moved by a boat elevating means 68 such as an elevator. A ball screw may be used as the boat elevating means 68, for example. By placing the process-object boat 20 on the lid 70 and then by elevating the lid 70, the process-object boat 20 can be loaded into the processing vessel 64 through a lower end opening of the processing vessel 64. At this time, the lower end opening of the processing vessel 64 can be hermetically sealed by the lid 70.

Disposed on a side of the lower end opening of the processing vessel 64 is a shutter 72 that is slidably moved to close the lower end opening, when the process-object boat 20 is moved downward and unloaded. Further, a boat transport mechanism 74, which is capable of being expanded and contracted and being turned, is disposed in the vicinity of the lowered lid 70 and the boat tables 52 and 54. Thus, the process-object boat 20 can be transported between the boat table 52 and the lid 70, between the boat table 54 and the lid 70, and between the boat tables 52 and 54.

In the upper part of the process-object transport area 10, there is provided a temperature measuring means 86 (see, FIG. 1) which is a characteristic feature of the present invention, whereby a temperature of the atmosphere in the process-object transport area 10 can be detected. To be specific, the temperature measuring means 86 is formed of a thermocouple 86A disposed on a ceiling part, which is above the transport arm mechanism 56, i.e., at a position near an upper end of the arm elevating means 58, so as to detect a temperature of the atmosphere at this position.

Not limited to the thermocouple 86A, a radiation pyrometer may be used as the temperature measuring means 86, for example. In addition, a position at which the temperature measuring means 86 is installed is not limited to the aforementioned ceiling part. For example, the temperature measuring means 86 may be installed at a position of a top dead center of the transport arm mechanism 56 (a maximum position at which the transport arm mechanism arrives) during a wafer transport operation.

A measurement value of the temperature measuring means 86 is inputted to a transport control part 88 formed of, e.g., a computer, and the transport control part 88 is configured to control the transport operations of the transport arm mechanism 56 and the arm elevating means 58, based on the measurement value. Specifically, the transport control part 88 controls the wafer transport operation in the following manner. That is to say, the transport control part 88 forbids (prohibits) the wafer transport operation, on and after the temperature measuring means 86 detecting a first temperature after an unloading operation for lowering the process-object boat 20 from the processing unit 24 has been started. Then, the transport control part 86 releases the forbiddance (prohibition) of the wafer transport operation so as to enable the wafer transport operation, on and after the temperature measuring means 86 detecting a second temperature that is higher than the first temperature after the process-object boat 20 has reached a lowermost end so that the unloading operation has been completed. Thus, the transport arm mechanism 56 can be prevented from being thermally damaged.

During the time period when the wafer transport operation is forbidden, the transport arm mechanism 56 is moved down to a position having a lowermost temperature in the process-object transport area 10, i.e., to a lower part (bottom part) in the process-object transport area 10. For example, the transport arm mechanism 56 is withdrawn to a bottom position (bottom dead center) 90 (see, FIG. 1).

In the process-object transport area 10, a side flow of a clean air or an inert gas such as an $N_2$ gas is constantly formed, so as to maintain clean the inside of the process-object transport area 10, and to cool the atmospheric temperature thereof.

Control of the overall operation of the processing system 2, for example, the operation for loading and unloading the storage box 6 into and from the storage-box transfer area 8, the operation of transporting wafers W in the process-object transport area 10, the operation for transporting the process-object boat 20, the operation for vertically moving the process-object boat 20, and the thermal processing operation (film deposition process and so on) in the processing unit 24, are controlled by an apparatus control part 92 formed of a computer, for example. In this case, the transport control part 88 is under the control of the apparatus control part 92. Programs (readable by a computer), which are required for controlling the apparatus control part 92 and the transport control part 88, are stored in a storage medium 94. The storage medium 94 is formed of, e.g., a flexible disc, a CD (Compact Disc), a hard disc, or a flash memory.

Figure 4:
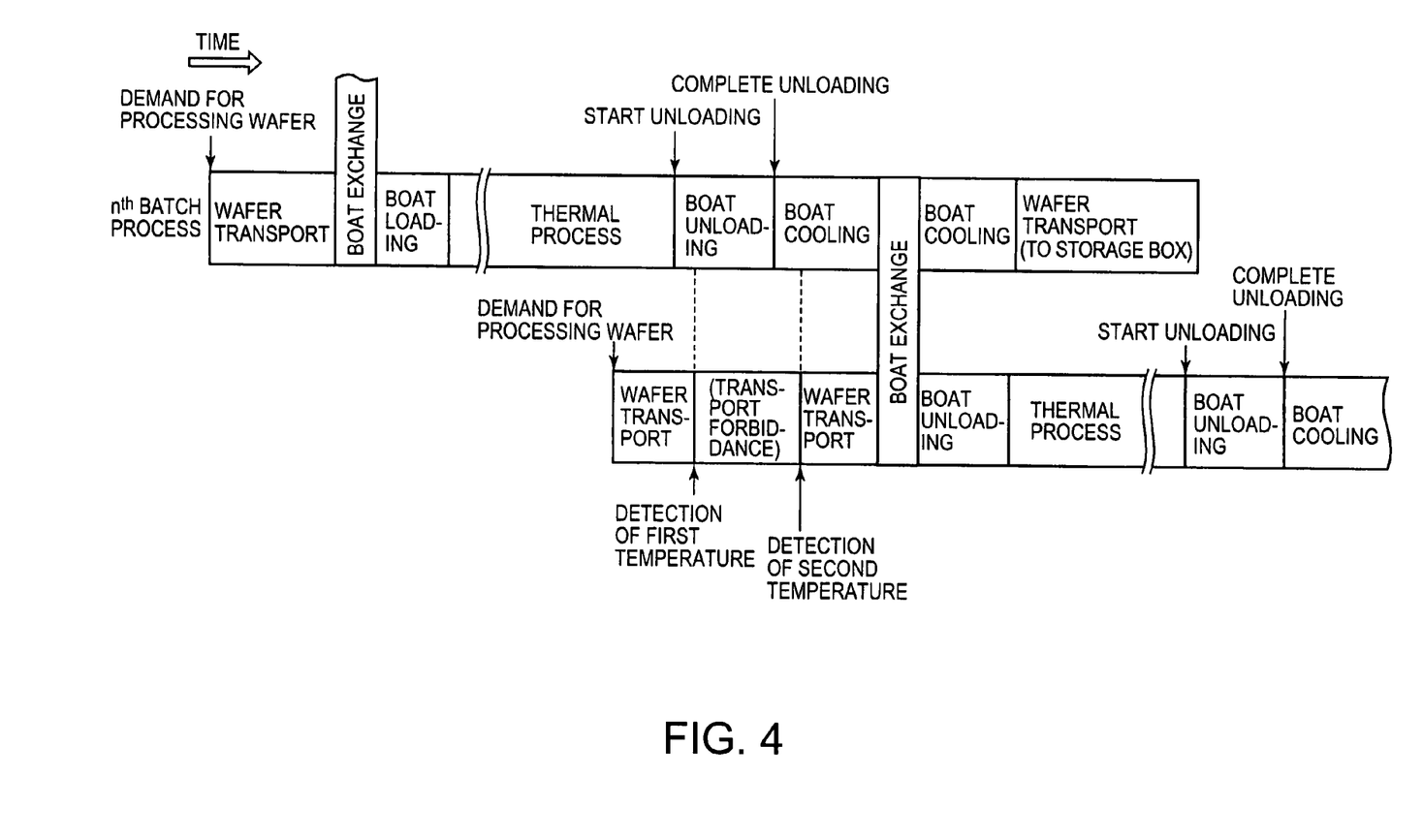
FIG. 4 is a view showing an example of a timing chart of respective steps in a process of one batch.
Figure 5:
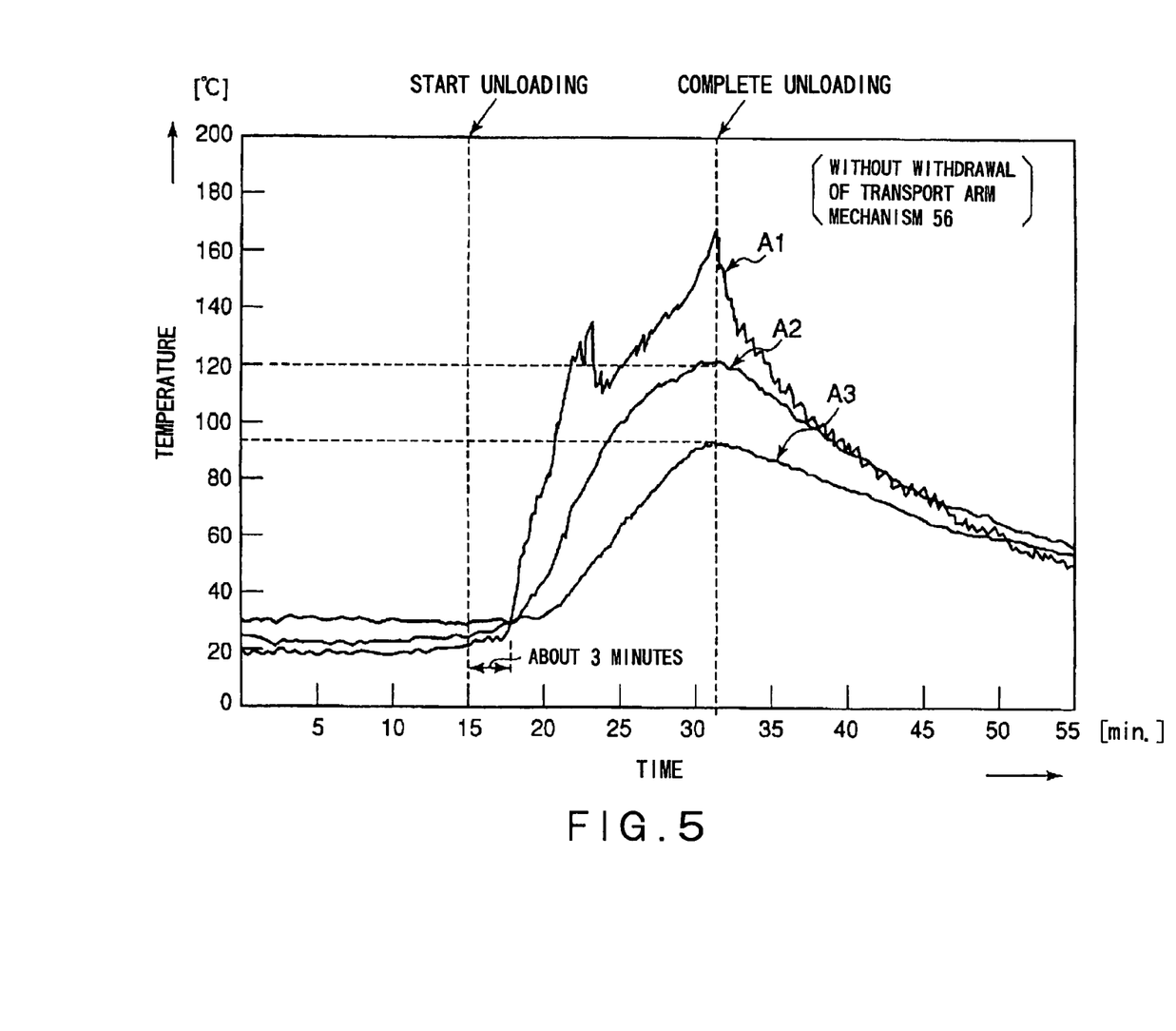
FIG. 5 is a graph showing a change of temperatures of respective parts in the process-object transport area, when the transport arm mechanism is not withdrawn.
Figure 6:
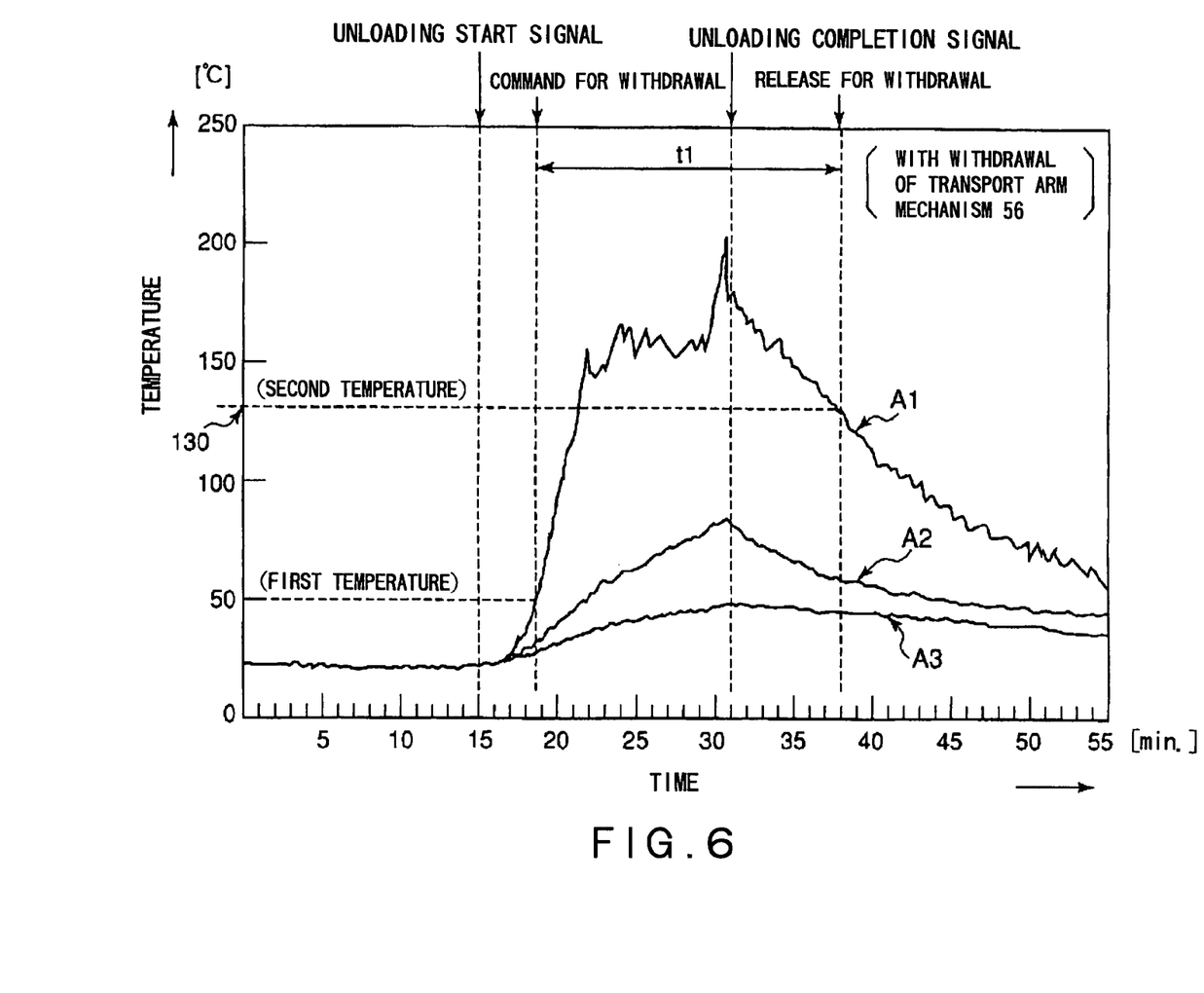
FIG. 6 is a graph showing a change of temperatures of the respective parts in the process-object transport area, when the transport arm mechanism is withdrawn.
Figure 7:
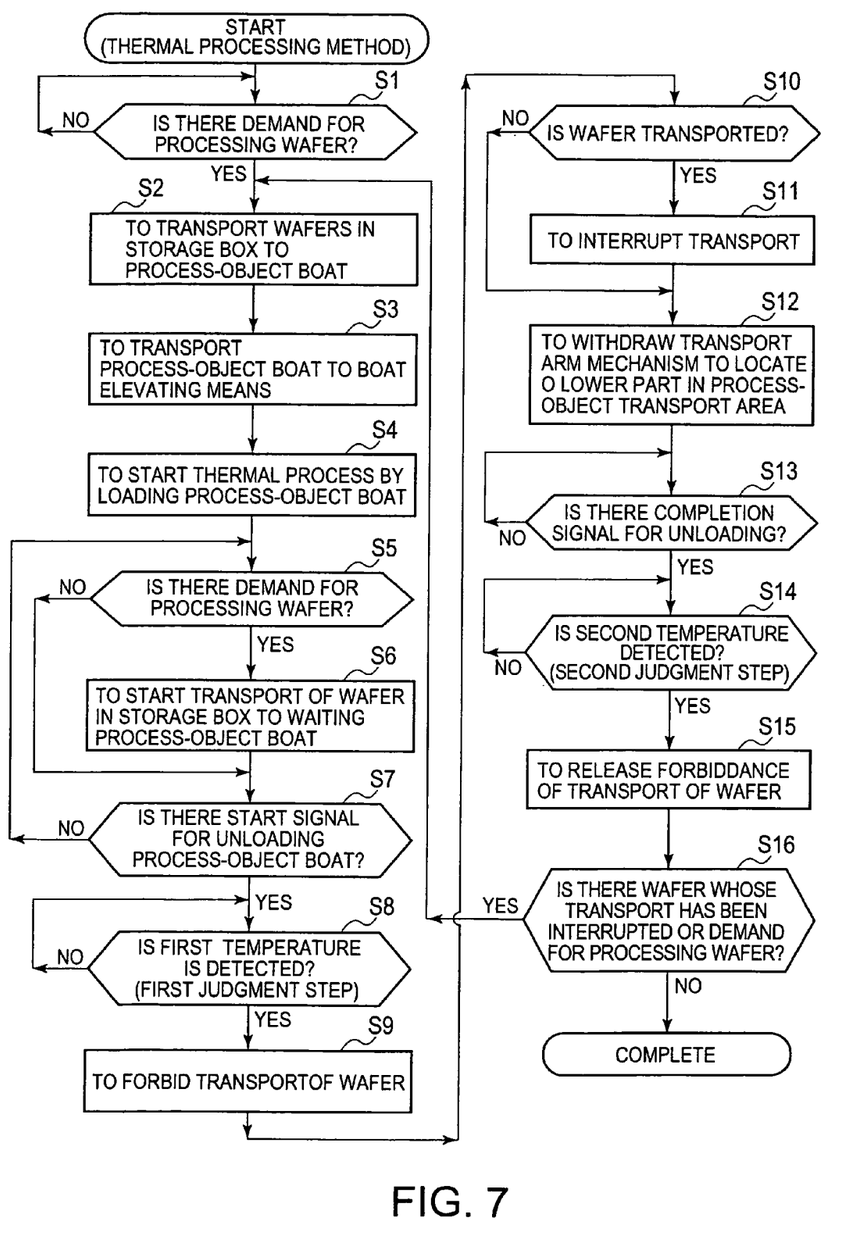
FIG. 7 is a flowchart showing all the steps of a thermal process including a step of transferring semiconductor wafers.

Next, an operation of the processing system 2 as structured above is described with reference also to FIGS. 4 to 7. FIG. 4 is a view showing an example of a timing chart of respective steps in a process of one batch. FIG. 5 is a graph showing a change of temperatures of respective parts in the process-object transport area, when the transport arm mechanism is not withdrawn. FIG. 6 is a graph showing a change of temperatures of the respective parts in the process-object transport area, when the transport arm mechanism is withdrawn. FIG. 7 is a flowchart showing all the steps of a thermal process including a step of transferring semiconductor wafers.

At first, in the inside of the process-object transport area 10, a side flow of an inert gas such as an $N_2$ gas is formed to provide an $N_2$ atmosphere, in order to prevent adhesion of a natural oxidation film onto a surface of a wafer. Meanwhile, in the inside of the storage-box transfer area 8, a down flow of a clean air is formed to maintain a clean air atmosphere.

An overall flow of a semiconductor wafer W is described in the first place. Namely, the storage box 6, which has been transferred from outside into the storage-box transfer area 8, is placed on the outside table 28 such that the lid 6A is opposed to the box loading/unloading opening 26. Then, by moving forward the slide plate 32 on the outside table 28 on which the storage box 6 is placed, the storage box 6 is conveyed to the inside table 30.

Then, the box transfer arm 38 is driven to approach the storage box 6 and to receive and hold the same. Further, by driving the elevator 36, the storage box 6 is transferred upward to a predetermined position corresponding to the shelf board 34 of the stocker part 18, and is set on the shelf board 34. The storage box is temporarily placed thereon on standby. At the same time, the box transfer arm 38 approaches another storage box 6 which has been temporarily placed on standby on another shelf board 34 and thus wafers stored therein are now intended to be processed. After the box transfer arm 38 receives the storage box 6, the elevator 36 is driven to lower the box transfer arm 38.

When the table 42 of the transport stage 22 is vacant, the storage box 6 is transported to the table 42 of the transport stage 22. Alternatively, when another storage box 6 has been already set on the table 42, the storage box 6 on the box transfer arm 38 is received by the box transfer arm for waiting 50 and is transferred near the opening 40. The storage box 6 gripped by the transfer arm for waiting 50 waits there. The lid 6A of the storage box 6 on the table 42 faces the door 46, and the storage box 6 is pressed and urged so as to be fixed on the table 42 by the horizontal actuator 44 disposed on one side of the table 42.

Under this state, the lid opening/closing mechanism 48 is driven such that the door 46 of the opening 40 and the lid 6A of the storage box 6 are detached by horizontally sliding the door 36 and the lid 6A so as to be withdrawn. By driving the transport arm mechanism 56 and the arm elevating means 58, wafers W stored in the storage box 6 are taken out five by five, in this embodiment, and the wafers W are transported to the process-object boat (the one process-object boat) 20 located on the boat table for transport 52.

In this case, when the process-object boat 20 can accommodate one hundred wafers, and the storage box 6 stores twenty five wafers, wafers are taken out from the four storage boxes 6 and are transported to the process-object boat 20. Then, a process of one batch is performed.

After the transport operation of the wafers W to the process-object boat 20 is completed, the boat transport mechanism 74 is then driven so as to deliver the process-object boat 20 on the boat table for transport 52 to the lid 70 that has been lowered at the lowest end position. At this time, when there is the other unloaded process-object boat 20 containing thermally processed wafers on the lid 70, the former process-object boat 20 is delivered in advance to the boat stage for waiting 54 by means of the boat transport mechanism 74.

Then, after completion of the transport operation of the process-object boat 20 containing the unprocessed wafers, the boat elevating means 68 is driven to elevate the process-object boat 20 together with the lid 70 on which the process-object boat 20 is placed, so that the process-object boat 20 is loaded into the processing vessel 64 of the processing unit 24 through the lower end opening of the processing vessel 64.

After that, the lower end opening of the processing vessel 64 is hermetically sealed by the lid 70. Under this state, the wafers W are subjected to a predetermined thermal process, such as a film deposition process and/or an oxidation and diffusion process, in the processing unit 24. In this case, depending on a manner of the thermal process, a temperature of the wafer W reaches as high as 800° C. to 1000° C.

After the thermal process of a predetermined period is completed, the processed wafers W are taken out by reversely performing the aforementioned operations. That is to say, by starting the unloading operation, the process-object boat 20 is lowered from the processing vessel 64 to finish the loading operation. At this time, when the unloading operation is started so that the process-object boat 20 is started to be lowered, a temperature of the atmosphere in the process-object transport area 10 is increased to a high temperature. Thus, the transport arm mechanism 56, which is poor in heat resistance, is moved downward, which is described below. Then, the unloaded process-object boat 20 is transported by the boat transport mechanism 74 to the boat table for transport 52 via the boat table for waiting 54, or directly to the boat table for transport 52 without passing through the boat table for waiting 54. During this transport operation, the processed wafers W are cooled to a certain degree.

Then, the processed wafers W are transported from the process-object boat 20 to the vacant storage box 6 placed on the table 42 of the transport stage 22, with the use of the transport arm mechanism 56 and the arm elevating means 58. After completion of the transport operation of the processed wafers W to the storage box 6, the door 46 is attached to the opening 40. Then, by driving the lid opening/closing mechanism 48, the lid 6A held by the same is attached to the storage box 6.

Following thereto, the box transfer arm 38 in the storage-box transfer area 8 is driven so as to temporality place the storage box 6 on standby in the stocker part 18. Alternatively, the storage box 6 is not placed in the stocker part 18, but is transferred outside the processing system 2 through the box loading/unloading opening 26. While the storage box 6 storing the processed wafers is being transferred by the box transfer arm 38, the box transfer arm for waiting 50, which has been waited with gripping another vacant storage box 6, sets the vacant storage box 6 on the table 42, so that the other processed wafers can be started to be received by the vacant storage box 6. In this case, the four vacant storage boxes 6 are used, for example. Then, the process of one batch of wafers is completed. Hereafter, the same operation is repeated. The above-described flow of the storage boxes 6 is merely taken by way of example, and is not limited thereto as a matter of course.

When there is performed the unloading operation in which the process-object boat 20 of a high temperature is lowered from the processing vessel 64 of a high temperature, the transport operation of the transport arm mechanism 56 is forbidden, and the transport arm mechanism 56 is moved downward so as to be withdrawn to the bottom position 90 shown in FIG. 1, in order to prevent the transport arm mechanism 56, which is poor in heat resistance, from being thermally damaged. The reason for this downward withdrawal of the transport arm mechanism 56 is as follows. Namely, in the process-object transport area 10, an atmospheric temperature in the upper part of the area 10 is increased to a considerable degree by heats released from the process-object boat 20 and the wafers W of a high temperature, and by a convection in the inner atmosphere. On the other hand, increase in atmospheric temperature in the lower part of the area 10 is relatively smaller.

In a conventional processing system, a time period in which the transport operation of the transport arm mechanism is forbidden is set from a time point when the unloading operation of the process-object boat 20 is started, to a time point when the process-object boat 20 reaches the lowermost end so that the unloading operation is completed and thereafter the atmosphere in the process-object transport area 10 is empirically cooled enough. Namely, as long as about ten minutes are fixedly set for the forbiddance period, and the wafer transport operation is forbidden for this long period of time. As a result, as has been described above, the wafer transport operation is delayed, inviting deterioration in throughput.

On the other hand, in the present invention, an atmospheric temperature of the process-object transport area 10 is detected by the temperature measuring means 86 formed of, e.g., the thermocouple 86A that is disposed on the ceiling part in the area 10. The transport arm mechanism 56 is not withdrawn immediately after the unloading operation of the process-object boat 20 is started, but is withdrawn when the temperature measuring means 86 detects the first temperature after the unloading operation has been started. Then, the forbiddance of the transport operation is released when the temperature measuring means 86 detects the second temperature that is higher than the first temperature after the unloading operation has been completed. In other words, the wafer transport operation is forbidden from a time point when the temperature measuring means 86 detects the first temperature, to a time point when the atmospheric temperature has reached a peak and then lowered to the second temperature, and the temperature measuring means 86 detects the second temperature.

Therefore, the time period in which the wafer transport operation is forbidden can be minimized, without thermally damaging the transport arm mechanism 56. Accordingly, the transport efficiency can be enhanced to thereby improve a throughput. The above-described control is performed by the transport control part 88 that is under the control of the apparatus control part 92 for controlling the overall operation of the processing system 2.

An example of the respective steps in the heat process for each batch is shown as a timing chart. Herein, there is shown an example of the timing chart of an $n^{th}$ batch process (n is a positive integer) and an $(n+1)^{th}$ batch process.

As shown in FIG. 4, the main steps for each batch process include a step for transporting wafers, a step for exchanging the process-object boats, a step for loading the boat, a thermal processing step, a process for unloading the boat, a step for cooling the boat, a step for exchanging the boats, and a step for transporting the (processed) wafers, which are sequentially performed. For example, in the course of the $n^{th}$ batch process, when a demand for performing the $(n+1)^{th}$ batch process is issued by the apparatus control part 92, the wafer transport operation for transporting unprocessed wafers, which are intended to be processed by the $(n+1)^{th}$ batch process, is started in the process-object transport area 10. For example, as has been described above, one hundred wafers W stored in the four storage boxes 6 in total are transported to the process-object boat 20, while the storage boxes 6 are exchanged.

During the wafer transport operation, even when the $n^{th}$ thermal process is completed and the process-object boat 20 is started to be unloaded, this wafer transport operation is continuously performed. However, immediately after the detection of the first temperature by the temperature measuring means 86, the wafer transport operation is forbidden, i.e., interrupted.

While the wafer transport operation is forbidden, the transport arm mechanism 56 is withdrawn to the bottom position 90 and located thereat. Subsequently, immediately after the temperature measuring means 86 detects the second temperature after the completion of the unloading operation of the process-object boat 20, the forbiddance of the wafer transport operation is released, that is, the interrupted wafer transport operation is started again. Thus, as compared with the time period in which the wafer transport operation is forbidden lasts for about 26 minutes in the conventional processing system, the time period can be reduced to 20 minutes or less in the processing system of the present invention. As a result, the wafer transport operation can be rapidly and efficiently performed to thereby improve a throughput.

In the case shown in FIG. 4, in the $(n+1)^{th}$ bath process, the wafer transport operation is divided in two by the boat unloading operation. However, when the issuance timing of the demand for performing the $(n+1)^{th}$ batch process differs, for example, the demand is issued earlier, it goes without saying that the wafer transport operation is consecutively performed without interruption.

Temperature changes in the process-object transport area 10 were actually measured, and a result thereof is described with reference to FIGS. 5 and 6. FIG. 5 is a graph showing a change of temperatures of respective parts in the process-object transport area, when the transport arm mechanism is not withdrawn. FIG. 6 is a graph showing a change of temperatures of the respective parts in the process-object transport area, when the transport arm mechanism is withdrawn. Herein three thermocouples were used, with the first one being disposed on the ceiling part corresponding to the installation position of the temperature measuring means 86, the second one being disposed on the mapping sensor 82 located on the distal end of the central arm 80C of the transport arm 80C, and the third one being disposed on the electronic component 84 (see, FIG. 3) covered with the cover 76A of the base support 76.

A curve A1 represents measurement values of the thermocouple on the ceiling part, a curve A2 represents measurement values of the thermocouple on the mapping sensor, and a curve A3 represents measurement values of the thermocouple on the electronic component. There are shown temperatures which were obtained when the process-object boat 20 heated at 780° C. was unloaded, with a side flow being formed in the process-object transport area 10. The unloading period was set to be about 16 minutes.

FIG. 5 shows the case in which, after the start of the unloading operation, the wafer transport operation was continued without withdrawing the transport arm mechanism 56. In this case, the respective curves A1 to A3 show that the temperatures were not increased for a while after the start of the unloading operation, and the temperatures started to be increased after three minutes had elapsed. In this case, as shown by the curve A, the temperature of the thermocouple on the ceiling part was drastically increased. Although there were some increase and decrease in temperature, the temperature was continuously increased until the unloading operation was completed to reach a peak temperature of about 170° C. After the unloading operation was completed, the temperature was drastically decreased.

As shown by the curve A2, the temperature of the thermocouple on the mapping sensor was increased at an angle that was more moderate than that of the curve A1. The temperature was continuously increased until the unloading operation was completed to reach a peak temperature of about 120° C. After the unloading operation was completed, the temperature was modestly decreased. As shown by the curve A3, the temperature of the thermocouple on the electronic component was increased at an angle that was furthermore moderate than that of the curve A2. The temperature was continuously increased until the unloading operation was completed to reach a peak temperature of about 90° C. After the unloading operation was completed, the temperature was modestly decreased.

In view of the above result, it can be understood that, when the unloading operation of the process-object boat 20 is started, it is not necessary to immediately withdraw the transport arm mechanism 56. Namely, it can be understood that, even when the wafer transport operation is continued for about three minutes after the start of the unloading operation, the transport arm mechanism 56 is not thermally damaged.

The maximum heat-resistant temperature of the mapping sensor 82 is about 130° C., for example. Meanwhile, the maximum heat-resistant temperature of the electronic component 84 covered with the cover 76A is about 50° C., for example, which is lower than that of the mapping sensor 82. Thus, in order to efficiently perform the wafer transport operation without the transport arm mechanism 56 being thermally damaged, the maximum heat-resistant temperature of the electronic component 84, i.e., a temperature of 50° C. is defined as the first temperature, and the maximum heat-resistant temperature of the mapping sensor 82, i.e., a temperature of 130° C. is defined as the second temperature.

A reason therefor is as follows. At a timing when the wafer transport operation is forbidden and a command for withdrawal is issued, there is a tendency that the atmospheric temperature in the process-object transport area 10, in particular, the atmospheric temperature at the ceiling part of the area 10 is drastically increased, and that the atmospheric temperature at the bottom is also increased although in the moderate manner. In other words, the environment in the process-object transport area 10 becomes gradually, thermally severer. Thus, the maximum heat-resistant temperature of the electronic component 84, which is most vulnerable to a heat, is used as a trigger for the withdrawal.

On the other hand, at a timing when the command for releasing the withdrawal is issued to release the forbiddance of the wafer transport operation, there is a tendency that the atmospheric temperature in the process-object transport area 10, in particular, the atmospheric temperature at the ceiling part of the area 10 is drastically decreased, and that the atmospheric temperature at the bottom is also decreased although in the moderate manner. In other words, the environment in the process-object transport area 10 becomes gradually, thermally lenient. Thus, the maximum heat-resistant temperature of the mapping sensor 82, which is directly exposed to the atmosphere, is used as a trigger for the withdrawal. In this case, there is a fear that the electronic component 84 vulnerable to a heat is thermally damaged. However, since the electronic component 84 is covered with the cover 76A, there is no drastic increase in temperature (see, curve A3 in FIG. 5), and thus the electronic component 84 can be prevented from being thermally damaged.

FIG. 6 shows temperature changes in the process-object transport area 10, which were measured based on the aforementioned concept. Namely, when the temperature measuring means 86 detected the first temperature (50° C.), the wafer transport operation was forbidden and the command for withdrawing the transport arm mechanism 56 was issued, and when the temperature measuring means 86 detected the second temperature (130° C.) after the completion of the unloading operation, the command for releasing the withdrawal was issued.

As shown in FIG. 6, due to the command for withdrawal, the transport arm mechanism 56 is moved to be located at the bottom position 90. Thus, as shown in curves A2 and A3, it can be understood that, since increase in temperatures of the mapping sensor 82 and the electronic component 84 is restrained, the mapping sensor 82 and the electronic component 84 are prevented from being thermally damaged. In this case, a time period to in which the wafer transport operation is forbidden is about 19 minutes, which is significantly shorter than the conventional time period of 26 minutes in the conventional processing system. Accordingly, the wafer transport efficiency can be improved.

Next, a series of operations are described with reference also to a flowchart shown in FIG. 7.

At first, it is judged whether there is a demand for processing wafers by the apparatus control part 92 (S1). In this case, when the storage box 6 storing unprocessed wafers is placed in the stocker part 18, or when the storage box 6 storing unprocessed wafers is transferred from outside, a demand for processing wafers is formed in accordance with this order.

When there is a demand for processing wafers is present (YES in S1), the storage box 6 is set on the table 42 of the transport stage 22, and the wafers W therein are transported to the waiting process-object boat 20 in the process-object transport area 10 (S2). Then, after completion of the transport of one hundred wafers W that have been stored in the four storage boxes 6, the process-object boat (the one process-object boat) 20 is transported to the boat elevating means 68 (boats are exchanged) by the boat transport mechanism 74 (S3).

After the process-object boat 20 is transported, the process-object boat 20 is elevated by the boat elevating means 68 so as to be loaded into the processing vessel 64 of the processing unit 24, and then a thermal process to the wafers W is started (S4).

Then, in the course of the thermal process of the wafers W, it is judged whether there is a demand for processing wafers W (S5). When there is a demand for processing wafers (YES in S5), there is started a transport operation, which is similar to the step S2, for transporting unprocessed wafers W stored in the storage box 6 from the storage box 6 to the waiting process-object boat (the other of the process-object boat) 20 (S6). The process-object boat 20 has the two process-object boats 20A and 20B, in this embodiment, which are alternately used.

When there is no demand for processing wafers (NO in S5), or when the above wafer transport operation is being performed, it is judged whether there is a command for starting the unloading operation of the process-object boat 20 (S7). When the thermal processing operation of the wafers is completed, the apparatus control part 92 issues a command for starting the unloading operation.

When the above judging step judges that there is no command for starting the unloading operation (NO in S7), the program returns to the step S5. On the other hand, the judging step judges that there is a command for starting the unloading operation (YES in S7), the apparatus control part 92 starts the unloading operation by lowering the process-object boat 20 having a temperature as high as 780° C., for example. A few minutes later after the start of the unloading operation, the atmospheric temperature in the process-object transport area 10 will be increased, which has been described with reference to FIGS. 5 and 6.

The fact that there is a command for starting the unloading operation is notified by an unloading start signal from the apparatus control part 92 to the transport control part 88. Upon reception of the notification, the transport control part 88 judges whether the temperature measuring means 86 disposed on the ceiling part in the process-object transport area 10 detects the first temperature (e.g., 50° C.) or not (NO in S8). Namely, a first judging step is performed. When the first temperature (e.g., 50° C.) is detected in the first judging step (YES in S8), the transport control part 88 forbids or prohibits the wafer transport operation (S9). When the wafers are being transported (YES in S10), the transport control part 88 interrupts the wafer transport operation (S11). Then, the transport control part 88 controls the transport arm mechanism 56 and the arm elevating means 58 to cause the transport arm mechanism 56 to withdraw to be located on the lower part (S12). In addition, when the wafers are not being transported (NO in S10), the transport control part 88 similarly causes transfer arm mechanism 56 to withdraw to be located on the lower part (S12). Thus, the transport arm mechanism 56 can be prevented from being thermally damaged.

Then, under the state in which the transport arm mechanism 56 is withdrawn, the transport control part 88 judges whether an unload completion signal that shows a completion of the unloading operation is notified from the apparatus control part 92 or not, and waits the notification of the unload completion signal (S13). Thereafter, when the control apparatus part 88 receives the unload completion signal, the transport control part 88 judges whether the temperature measuring means 86 detects the second temperature (e.g., 130° C.) or not (NO in S14). Namely, a second judging step is performed.

In the second judging step, when the second temperature (e.g., 130° C.) is detected (YES in S14), the forbiddance (prohibition) of the wafer transport operation is released (S15). Due to this release, when the wafer transport operation has been interrupted, or when there is a demand for processing wafers (YES in S16), the program returns to the step S2, and the wafer transport operation is started again or started. Alternatively, when there is no interruption of the wafer transport operation or there is no demand for processing wafers (NO in S16), the process is completed.

According to the present invention, the temperature measuring means 86 is disposed on the upper part of the process-object transport area 10 in which the semiconductor wafers W as objects to be processed are transported to the process-object boat 20. Based on a measurement value of the temperature measuring means 86, the transport arm mechanism 56 and the arm elevating means 58 are controlled such that the transport operation of the transport arm mechanism 56 is adjusted. Thus, a time period in which the transport arm mechanism 56 is withdrawn can be minimized while preventing the transport arm mechanism 56 from being thermally damaged. Accordingly, the transport operation of the objects to be processed can be more effectively performed, to thereby improve a throughput.

The first temperature and the second temperature in the above embodiment are merely taken by way of example. When maximum heat-resistant temperatures of the corresponding respective members vary, it goes without saying that the first temperature and the second temperature are varied in accordance therewith.

In addition, although given herein as an example to describe the temperature measuring means 86 is a case in which the number thereof is one, the plurality of temperature measuring means 86 may be provided. In this case, it is preferable that at least one temperature measuring means 86 is disposed above the transport arm mechanism 56. When the plurality of temperature measuring means 86 are disposed, the highest measurement value of an atmospheric temperature out of the values detected by the temperature measuring means 86 is taken as an effective one.

In addition, the temperature measuring means 86 is disposed on the upper part in the process-object transport area 10, more specifically, on the ceiling part thereof. However, not limited thereto, the temperature measuring means 86 may be disposed on a maximum position (top dead center) at which the transport arm mechanism 56 arrives during the wafer transport operation.

Moreover, in the above embodiment, the temperature measuring means 86 is disposed on the upper part in the process-object transport area 10. In addition thereto, it is possible to provide the transport arm mechanism 56 with another temperature measuring means, with a view to ensuring the safety of the operation. To be specific, another temperature measuring means formed of, e.g. a thermocouple may be disposed on the mapping sensor 82 or the electronic component 84 of the transport arm mechanism 56, so as to directly monitor a temperature of the object to be monitored. In this case, when a maximum heat-resistant temperature of the object to be monitored is detected, the transport arm mechanism 56 is withdrawn. According to this structure, even when the temperature measuring means on the ceiling part has trouble, for example, the safety of the operation can be assured.

Further, in this embodiment, an $N_2$ gas is used as an inert gas. However, not limited thereto, a rare gas such as an Ar gas and a He gas may be used.

In addition, given herein as an example to describe the processing system 2 is a case in which the storage-box transfer area 8 is located in front of the process-object transport area 10. However, not limited thereto, it is possible to omit the storage-box transfer area 8, and to use this space as a working area in a clean room. In this case, the processing system may have a structure in which an operator directly places the storage box 6 on the table 42 of the transport stage 22.

In addition, in the above embodiment, the semiconductor wafer is used as an object to be processed. However, not limited thereto, the present invention may be applied to a glass substrate, an LCD substrate, a ceramic substrate, and so on.

The invention claimed is:

1. A processing system for a process object surrounded by a partition wall, the processing system comprising:
    a vertical processing unit configured to thermally process the process object;
    a process-object transport area disposed below the processing unit;
    a pair of process-object boats configured to hold the process objects in a tier-like manner;
    a boat elevating means configured to vertically move process-object boats so as to load and unload one process-object boat into and from the processing unit;
    a boat table for transport disposed in the process-object transport area, on which the other process-object boat can be placed, when the process objects are transported;
    a transport arm mechanism configured to transport the process objects between a storage box placed on a transport stage disposed on the partition wall and the other process-object boat placed on the boat table for transport;
    an arm elevating means configured to vertically move the transport arm mechanism;
    a temperature measuring means disposed on an upper part in the process-object transport area; and
    a transport control part configured to control the processing system such that:
        a transport operation of the transport arm mechanism and the arm elevating means may be performed, based on a measurement value from the temperature measuring means, wherein the operation includes a thermal processing step in which the one process-object boat holding a plurality of process objects is loaded into the processing unit by the boat elevating means so as to thermally process the process objects, and, after the thermal process, the one process-object boat is unloaded by the boat elevating means;

a transport step in which the process objects are transported between the storage box and the other process-object boat, by using the transport arm mechanism and the arm elevating means;

a temperature measuring step in which a temperature of an upper atmosphere in the process-object transport area is measured by the temperature measuring means;

a first judgment step in which the transport operation in the transport step is prohibited, in response to detection of a first temperature by the temperature measuring means; and a second judgment in which the prohibition of the transport operation in the transport step is released, in response to detection of a second temperature by the temperature measuring means.

2. The processing system for a process object according to claim 1, wherein disposed in the process-object transport area is a boat table for waiting, on which a process-object boat can be temporarily placed on standby.

3. The processing system for a process object according to claim 1, wherein an inside of the process-object transport area has an inert gas atmosphere or a clean air atmosphere.

4. The processing system for a process object according to claim 1, wherein the transport control part controls:

the transport arm mechanism and the arm elevating means such that the transport of the process objects is forbidden, on and after the temperature measuring means detects a first temperature, after an unloading operation for lowering the one process-object boat from the processing unit has-been started; and the transport arm mechanism and the arm elevating means such that the forbiddance of the transport of the process objects is released, on and after the temperature measuring means detects a second temperature that is higher than the first temperature, after the unloading operation has been completed.

5. The processing system for a process object according to claim 4, wherein on and after controlling the transport arm mechanism and the arm elevating means, the transport control part causes the transport arm mechanism to move to be located on a lower part in the process-object transport area, such that the transport of the process objects is forbidden.

6. The processing system for a process object according to claim 1, wherein:

the transport arm mechanism is provided with a mapping sensor that detects a position of the process object stored in the storage box, or a position of the process object supported by the other process-object boat; and the second temperature is a maximum heat-resistant temperature of the mapping sensor.

7. The processing system for a process object according to claim 1, wherein:

the transport arm mechanism is provided with an electronic component protected by a cover; and the first temperature is a maximum heat-resistant temperature of the electronic component.

8. The processing system for a process object according to claim 1, wherein there is disposed one or more temperature measuring means, and at least one temperature measuring means is positioned above the transport arm mechanism.

9. A thermal processing method for a process object, for thermally processing the process object with the use of a processing system for a process object surrounded by a partition wall, the processing system comprising:

a vertical processing unit configured to thermally process the process object;

a process-object transport area disposed below the processing unit;

a pair of process-object boats configured to hold the process objects in a tier-like manner;

a boat elevating means configured to vertically move the process-object boats so as to load and unload one process-object boat into and from the processing unit;

a boat table for transport disposed in the process-object transport area, on which the other process-object boat can be placed, when the process objects are transported;

a transport arm mechanism configured to transport the process objects between a storage box placed on a transport stage disposed on the partition wall and the other process-object boat placed on the boat table for transport;

an arm elevating means configured to vertically move the transport arm mechanism;

a temperature measuring means disposed on an upper part in the process-object transport area; and a transport control part configured to control a transport operation of the transport arm mechanism and the arm elevating means, based on a measurement value from the temperature measuring means; the processing method comprising:

a thermal processing step in which the one process-object boat holding a plurality of process objects is loaded into the processing unit by the boat elevating means so as to thermally process the process objects, and, after the thermal process, the one process-object boat is unloaded by the boat elevating means;

a transport step in which the process objects are transported between the storage box and the other process-object boat, by using the transport arm mechanism and the arm elevating means;

a temperature measuring step in which a temperature of an upper atmosphere in the process-object transport area is measured by the temperature measuring means;

a first judgment step in which the transport control part controls the transport arm mechanism and the arm elevating means so as to prohibit the transport operation in the transport step, in response to detection of a first temperature by the temperature measuring means; and a second judgment step in which the transport control part controls the transport arm mechanism and the arm elevating means so as to release the prohibition of the transport operation in the transport step, in response to detection of a second temperature by the temperature measuring means.

10. The thermal processing method for a process object according to claim 9, wherein during the prohibition of the transport operation, the transport control part controls the transport arm mechanism and the arm elevating means so as to cause the transport arm mechanism to withdraw to be located on a lower part in the process-object transport area.

11. The thermal processing method for a process object according to claim 9, wherein
the transport control part performs the first judgment step, on condition that the unloading operation has been started in the course of the thermal processing step.

12. The thermal processing method for a process object according to claim 9, wherein
the transport control part performs the second judgment step, on condition that the unloading operation has been completed in the course of the thermal processing step.

13. The thermal processing method for a process object according to claim 9, wherein:
the transport arm mechanism is provided with a mapping sensor that detects a position of the process object stored in the storage box, or a position of the process object supported by the other process-object boat; and
the second temperature is a maximum heat-resistant temperature of the mapping sensor.

14. The thermal processing method for a process object according to claim 9, wherein:
the transport arm mechanism is provided with an electronic component protected by a cover; and
the first temperature is a maximum heat-resistant temperature of the electronic component.

15. A computer program executable by a computer to perform a thermal processing method for a process object, for thermally processing the process object with the use of a processing system for a process object surrounded by a partition wall, the processing system comprising: a vertical processing unit configured to thermally process the process object; a process-object transport area disposed below the processing unit; a pair of process-object boats configured to hold the process objects in a tier-like manner; a boat elevating means configured to vertically move process-object boats so as to load and unload one process-object boat into and from the processing unit; a boat table for transport disposed in the process-object transport area, on which the other process-object boat can be placed, when the process objects are transported; a transport arm mechanism configured to transport the process objects between a storage box placed on a transport stage disposed on the partition wall and the other process-object boat placed on the boat table for transport; an arm elevating means configured to vertically move the transport arm mechanism; a temperature measuring means disposed on an upper part in the process-object transport area; and a transport control part configured to control a transport operation of the transport arm mechanism and the arm elevating means, based on a measurement value from the temperature measuring means;
the processing method comprising:
a thermal processing step in which the one process-object boat holding a plurality of process objects is loaded into the processing unit by the boat elevating means so as to thermally process the process objects, and, after the thermal process, the one process-object boat is unloaded by the boat elevating means;
a transport step in which the process objects are transported between the storage box and the other process-object boat, by using the transport arm mechanism and the arm elevating means;
a temperature measuring step in which a temperature of an upper atmosphere in the process-object transport area is measured by the temperature measuring means;
a first judgment step in which the transport control part controls the transport arm mechanism and the arm elevating means so as to prohibit the transport operation in the transport step, in response to detection of a first temperature by the temperature measuring means; and
a second judgment step in which the transport control part controls the transport arm mechanism and the arm elevating means so as to release the prohibition of the transport operation in the transport step, in response to detection of a second temperature by the temperature measuring means.

16. A storage medium storing a computer program executable by a computer to perform a thermal processing method for a process object, for thermally processing the process object with the use of a processing system for a process object surrounded by a partition wall, the processing system comprising: a vertical processing unit configured to thermally process the process object; a process-object transport area disposed below the processing unit; a pair of process-object boats configured to hold the process objects in a tier-like manner; a boat elevating means configured to vertically move process-object boats so as to load and unload one process-object boat into and from the processing unit; a boat table for transport disposed in the process-object transport area, on which the other process-object boat can be placed, when the process objects are transported; a transport arm mechanism configured to transport the process objects between a storage box placed on a transport stage disposed on the partition wall and the other process-object boat placed on the boat table for transport; an arm elevating means configured to vertically move the transport arm mechanism; a temperature measuring means disposed on an upper part in the process-object transport area; and
a transport control part configured to control a transport operation of the transport arm mechanism and the arm elevating means, based on a measurement value from the temperature measuring means;
the processing method comprising:
a thermal processing step in which the one process-object boat holding a plurality of process objects is loaded into the processing unit by the boat elevating means so as to thermally process the process objects, and, after the thermal process, the one process-object boat is unloaded by the boat elevating means;
a transport step in which the process objects are transported between the storage box and the other process-object boat, by using the transport arm mechanism and the arm elevating means;
a temperature measuring step in which a temperature of an upper atmosphere in the process-object transport area is measured by the temperature measuring means;
a first judgment step in which the transport control part controls the transport arm mechanism and the arm elevating means so as to prohibit the transport operation in the transport step, in response to detection of a first temperature by the temperature measuring means; and
a second judgment step in which the transport control part controls the transport arm mechanism and the arm elevating means so as to release the prohibition of the transport operation in the transport step, in response to detection of a second temperature by the temperature measuring means.

* * * * *